(12) United States Patent
Ling

(10) Patent No.: US 9,153,310 B2
(45) Date of Patent: Oct. 6, 2015

(54) DYNAMIC RANDOM ACCESS MEMORY FOR COMMUNICATIONS SYSTEMS

(71) Applicant: MaxLinear, Inc., Carlsbad, CA (US)

(72) Inventor: Curtis Ling, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 14/156,792

(22) Filed: Jan. 16, 2014

(65) Prior Publication Data

US 2014/0198597 A1 Jul. 17, 2014

Related U.S. Application Data

(60) Provisional application No. 61/753,237, filed on Jan. 16, 2013.

(51) Int. Cl.
*G11C 7/00* (2006.01)
*G11C 11/406* (2006.01)
*G11C 29/02* (2006.01)
*G11C 29/42* (2006.01)
*G11C 29/50* (2006.01)
*G11C 29/04* (2006.01)

(52) U.S. Cl.
CPC ........ *G11C 11/40611* (2013.01); *G11C 29/023* (2013.01); *G11C 29/028* (2013.01); *G11C 29/42* (2013.01); *G11C 29/50016* (2013.01); *G11C 11/406* (2013.01); *G11C 2029/0409* (2013.01); *G11C 2029/0411* (2013.01); *G11C 2207/104* (2013.01); *G11C 2211/4062* (2013.01)

(58) Field of Classification Search
CPC ........... G11C 11/406; G11C 11/40615; G11C 11/4061

USPC .............................. 365/222, 230.03, 206, 208
See application file for complete search history.

(56) References Cited

U.S. PATENT DOCUMENTS

| | | | |
|---|---|---|---|
| 4,506,364 A | 3/1985 | Aichelmann, Jr. et al. |
| 5,233,614 A | 8/1993 | Singh |
| 5,892,775 A | 4/1999 | Jayant et al. |
| 5,909,404 A | 6/1999 | Schwarz |
| 6,202,180 B1 | 3/2001 | Nose |
| 6,219,297 B1 | 4/2001 | Cho et al. |

(Continued)

OTHER PUBLICATIONS

Int'l Search Report and Written Opinion for PCT/US2012/023975 dated May 23, 2012.

(Continued)

*Primary Examiner* — Connie Yoha
(74) *Attorney, Agent, or Firm* — McAndrews, Held & Malloy, Ltd.

(57) ABSTRACT

An integrated circuit may comprise a digital logic circuit, a memory refresh circuit, a first one or more dynamic random access memory (DRAM) cells, and a second one or more DRAM cells. The first DRAM cell(s) may be refreshed by the memory refresh circuit whereas the second DRAM cell(s) is not refreshed by any memory refresh circuit. Each of the first DRAM cell(s) and the second DRAM cell(s) may be a one-transistor cell. The first DRAM cell(s) may be used for storage of data which is overwritten at less than a threshold frequency. The second DRAM cell(s) may be used for storage of data which is overwritten at greater than the threshold frequency. A rate at which the first DRAM cell(s) are refreshed may be adjusted during run-time of the integrated circuit.

58 Claims, 7 Drawing Sheets

(56) References Cited

U.S. PATENT DOCUMENTS

| | | | |
|---|---|---|---|
| 6,490,215 B2 * | 12/2002 | Komura et al. | 365/222 |
| 6,529,435 B2 * | 3/2003 | Yagishita et al. | 365/189.03 |
| 6,590,822 B2 * | 7/2003 | Hwang et al. | 365/222 |
| 8,295,115 B2 * | 10/2012 | Kim et al. | 365/222 |
| 8,448,042 B2 | 5/2013 | Spraul | |
| 2003/0182491 A1 | 9/2003 | Chudnovsky et al. | |
| 2004/0001381 A1 * | 1/2004 | Mori et al. | 365/203 |
| 2004/0047205 A1 * | 3/2004 | Hazama et al. | 365/202 |
| 2004/0117723 A1 | 6/2004 | Foss | |
| 2005/0071543 A1 | 3/2005 | Ellis et al. | |
| 2005/0078539 A1 | 4/2005 | Schoenfeld et al. | |
| 2006/0171210 A1 | 8/2006 | Nagashima et al. | |
| 2006/0291311 A1 * | 12/2006 | Won et al. | 365/206 |
| 2007/0014175 A1 * | 1/2007 | Min et al. | 365/222 |
| 2007/0133315 A1 | 6/2007 | Kang et al. | |
| 2008/0099808 A1 | 5/2008 | Burnett et al. | |
| 2009/0144506 A1 | 6/2009 | Barth, Jr. et al. | |
| 2010/0115376 A1 | 5/2010 | Shalvi et al. | |
| 2010/0157641 A1 | 6/2010 | Shalvi et al. | |
| 2010/0246297 A1 | 9/2010 | Zhang et al. | |
| 2010/0332894 A1 | 12/2010 | Bowers et al. | |

OTHER PUBLICATIONS

Int'l Search Report and Written Opinion for PCT/US2014/011861 dated Jun. 6, 2014.

* cited by examiner

US 9,153,310 B2

DYNAMIC RANDOM ACCESS MEMORY FOR COMMUNICATIONS SYSTEMS

CLAIM OF PRIORITY

This patent application makes reference to, claims priority to and claims benefit from U.S. Provisional Patent Application No. 61/753,237, which was filed on Jan. 16, 2013.

The above identified application is hereby incorporated herein by reference in its entirety.

BACKGROUND OF THE INVENTION

Conventional systems and methods for communications can be overly power hungry, slow, expensive, and inflexible. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Systems and methods for communications, substantially as shown in and/or described in connection with at least one of the figures, as set forth more completely in the claims.

Advantages, aspects and novel features of the present disclosure, as well as details of various implementations thereof, will be more fully understood from the following description and drawings.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
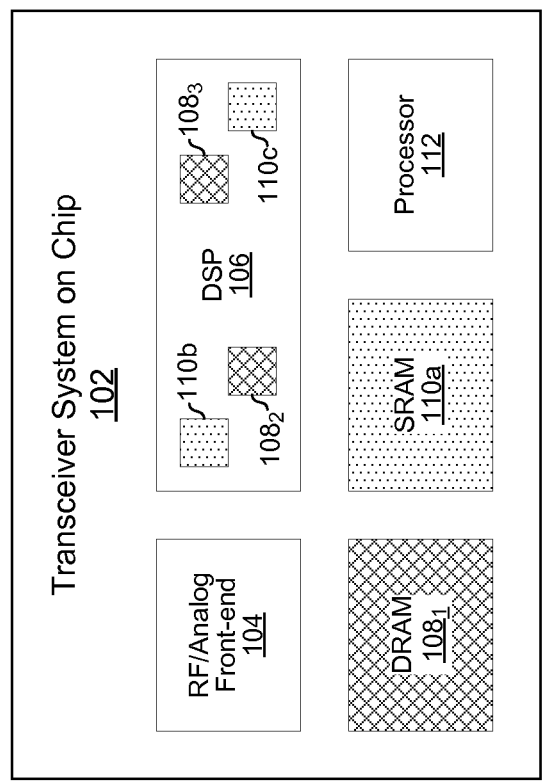
FIG. 1 depicts an example communication system comprising memory cells optimized for use in an error-tolerant system.

FIG. 1 depicts an example communication system comprising memory cells optimized for use in an error-tolerant system. In an example implementation depicted, the communication system comprises a system on chip (SoC) 102. For example, the SoC 102 may be integrated on a single silicon die. The SoC 102 comprises an RF/Analog front-end circuit 104, digital signal processing (DSP) circuit 106, one or more arrays of dynamic random access memory (DRAM) 108, one or more arrays of static random access memory (SRAM), and a processor 112.

The front-end circuit 104 is operable to interface the SoC 102 to a communication medium (e.g., wired bus or cable, optical fiber, or wireless channel). In instances that the front-end 104 is configured for reception, it may comprise, for example, a low noise amplifier, a mixer, a filter, and an analog to digital converter. In instances that the front-end 104 is configured for transmission, it may comprise, for example, a digital to analog converter, a filter, a mixer, and a power amplifier.

The processor 112 is operable to execute instructions (e.g., stored in the DRAM 108 and/or the SRAM 110) to control operations of the SoC 102. This may comprise, for example, configuring the front-end 104, configuring the DSP 106, and controlling reads and writes to/from the DRAM 108 and the SRAM 110.

The DSP 106 is operable to process digital signals. In this regard, the DSP 106 may comprise, for example, an equalizer, a detector, a de-mapper, a decoder, and/or the like.

Figure 5B:
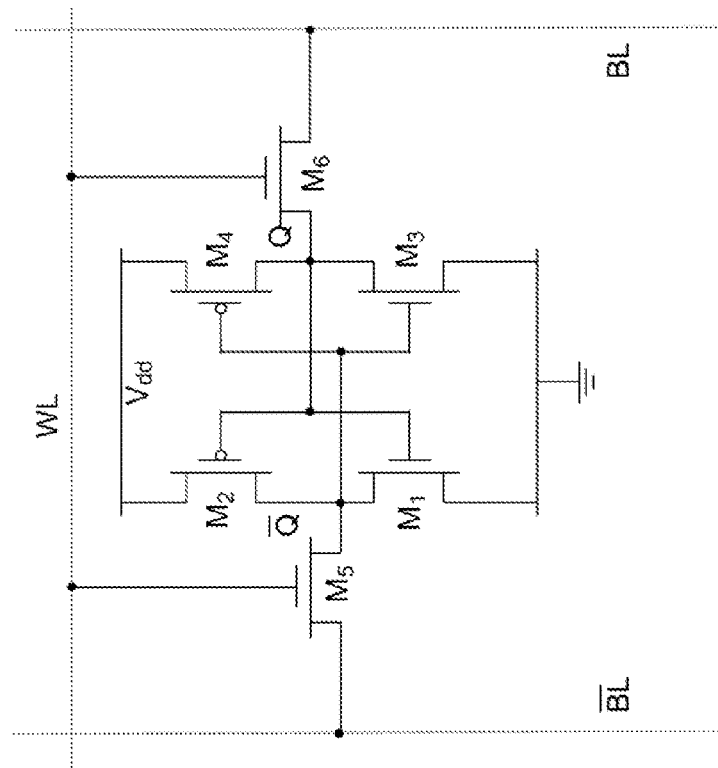
FIG. 5B depicts an example six-transistor ("6T") SRAM cell.

The SRAM 110 comprises one or more arrays of SRAM memory cells. The arrays may range in size from a single-bit to multiple megabits, or more. For example, each array of one or more SRAM cells may comprise one or more pages/rows distributed across one or more banks, with each page/row consisting of one or more columns, each column corresponding to particular address, and each column consisting of one or more cells. For example, array $110_1$ may be a relatively large number of SRAM cells whereas each of arrays $110_2$ and $110_3$ may comprise a relatively small number of SRAM cells. In an example implementation, each SRAM cell may be a six-transistor ("6T") cell, such as is shown in FIG. 5B. The transistors, $M_1$ through $M_6$, of each SRAM cell on the SoC 102 may be realized using the same fabrication process and same process design rules as the transistors of the SoC 102 that realize the digital logic.

Figure 5A:
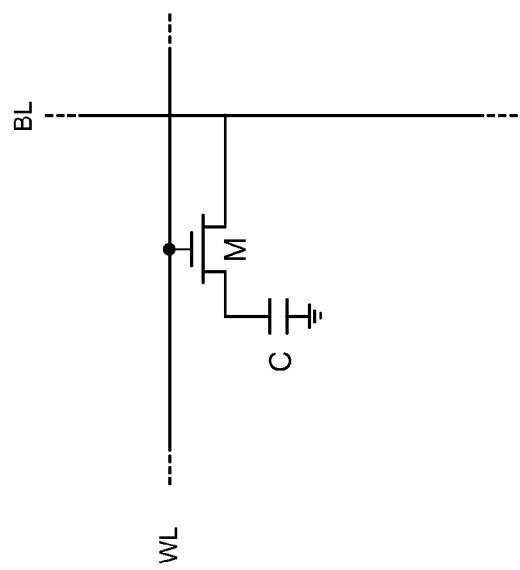
FIG. 5A depicts an example one-transistor ("1T") DRAM cell.

Referring back to FIG. 1, the DRAM 108 comprises one or more arrays of DRAM memory cells. The arrays may range in size from a single-bit to multiple megabits, or more. For example, each array of one or more DRAM cells may comprise one or more pages/rows distributed across one or more banks, with each page/row consisting of one or more columns/addresses, and each column/address consisting of one or more cells. For example, array $108_1$ may be a relatively large number of DRAM cells whereas each of arrays $108_2$ and $108_3$ may comprise a relatively small number of DRAM cells. In an example implementation, each DRAM cell may be a one-transistor ("1T") cell, such as is shown in FIG. 5A. The transistor, M, of each DRAM cell on the SoC 102 may be realized using the same fabrication process and same process design rules as the transistors of the SoC 102 that realize, for example, digital logic and $M_1$ through $M_6$ of the SRAM cells. This is in contrast to dedicated DRAM chips which often use semiconductor processes specialized for fabricating DRAM cells.

Figure 2:
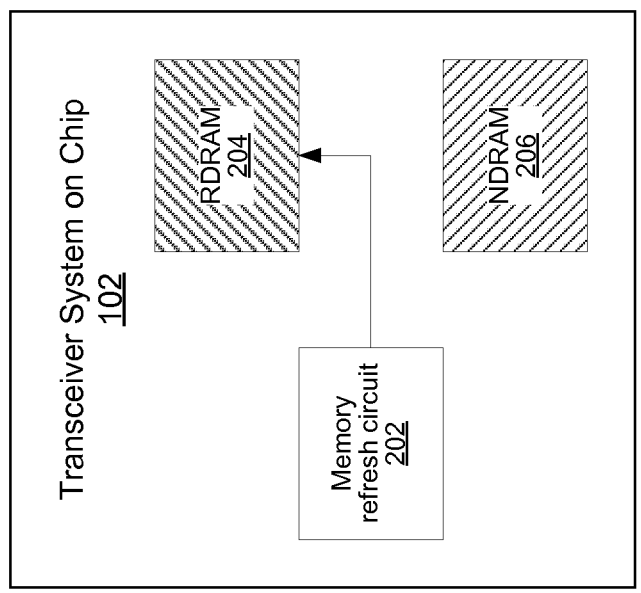
FIG. 2 is a block diagram illustrating a system comprising "non-refreshed" dynamic random access memory (NDRAM) and "refreshed" dynamic random access memory (RDRAM).

Referring now to FIG. 2, there is again shown the SoC 102. In FIG. 2, components of SoC 102 other than DRAM arrays 204 and 206, and memory refresh circuit 202, are omitted for clarity of illustration.

A DRAM cell stores a bit as the presence or absence of an electric charge on a capacitor. Because this charge inevitably leaks away due to non-idealities, eventually (after some time duration D) enough charge will leak away that the value of the bit is no longer sufficiently reliable (e.g., probability of error is greater than some threshold $T_{ERR}$). To prevent this loss of stored information, DRAM cells are conventionally refreshed at intervals of duration less than D. In effect, a refresh of a DRAM cell comprises reading the cell and immediately writing the read value back to the cell (restoring the amount of charge on the capacitor).

Each of the DRAM arrays 204 and 206 may correspond to a respective one of the arrays of DRAM 108 of FIG. 1. The DRAM array 204 is coupled to memory refresh circuit 202, and the memory refresh circuit 202 may be dedicated circuitry for performing refreshes of the array 204. The array 204 is accordingly referred to herein as "refreshed DRAM (RDRAM)".

There is no refresh circuitry coupled to the array 206. The array 206 is accordingly referred to herein as "non-refreshed DRAM (NDRAM)". Consequently, if a value sits in array 206 for longer than D the probability of reading an incorrect value from the array is greater than some determined threshold $T_{ERR}$. If, however, new values are written to array 206 at intervals that are shorter in duration than D, then significant time, power, and/or area overhead may be saved by not refreshing array 206 and/or not having refresh circuitry for array 206 at all.

In an example implementation, the SoC may not comprise any RDRAM cells and may, therefore, not comprise any DRAM refresh circuit.

Figure 3:
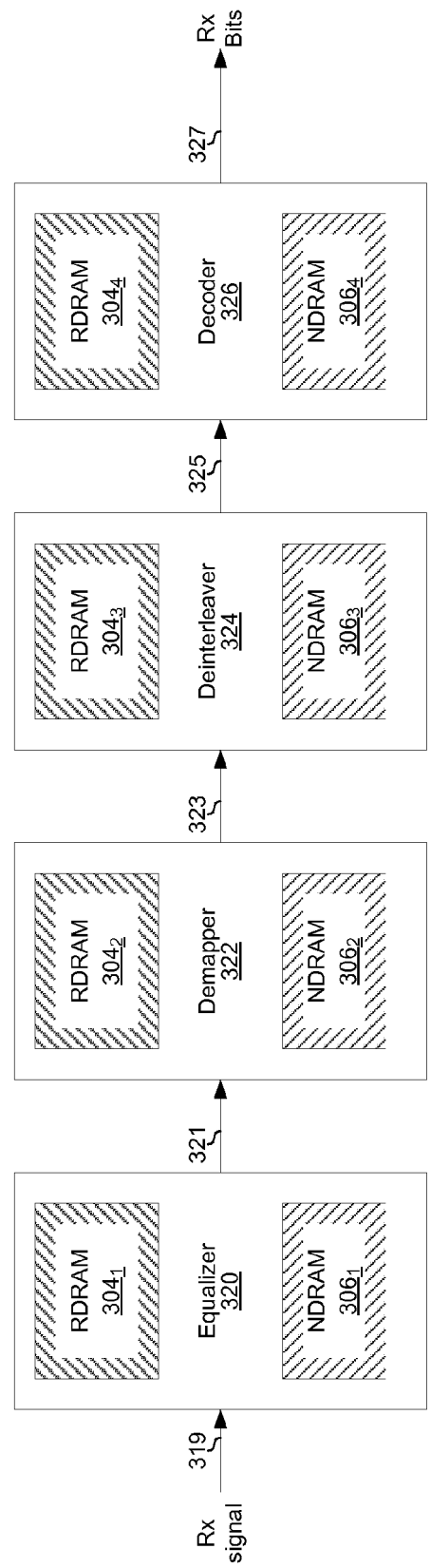
FIG. 3 is an example receiver system in which RDRAM is used for storing bits that are replaced/overwritten slowly/infrequently, whereas NDRAM is used for storing bits that are replaced/overwritten quickly/frequently.

FIG. 3 is an example receiver system in which RDRAM is used for storing bits that are replaced/overwritten slowly/infrequently, whereas NDRAM is used for storing bits that are replaced/overwritten quickly/frequently. Shown in FIG. 3, is an equalizer 320, a demapper 322, a deinterleaver 324, and a decoder 326. The components of FIG. 3 may, for example, reside in an example implementation of DSP circuit 106. Although the DRAM in FIG. 3 is depicted as eight arrays $304_1$-$304_4$ and $306_1$-$306_4$, physically the arrays may be grouped into any number of one or more grids.

For purposes of FIG. 3, it is assumed that all DRAM cells of arrays $304_1$-$304_4$ and $306_1$-$306_4$ have substantially the same layout (e.g., same transistor size, capacitor size, arrangement/orientation, and/or the like). Consequently, it is assumed that each of the DRAM cells of arrays $304_1$-$304_4$ and $306_1$-$306_4$ is characterized by the same value of D. In other implementations, cells of the various arrays 304 and 306 may be differently sized based on various factors such as, for example: the rate of change/replacement of information that the cell is to store, the error tolerance of the information that the cell is to store, whether it is to operate as an RDRAM cell or an NDRAM cell. Additional details of sizing RDRAM and NDRAM cells are described below with reference to FIG. 6.

The signal 319 is, for example, an output of front-end 104 (FIG. 1). The signal 319 is a digital signal with symbol rate S and symbol period 1/S.

The equalizer 320 is operable to process the signal 319 to generate signal 321. Such processing may comprise, for example, interference cancellation, level adjustment, filtering, and/or the like. The signal 321 is, for example, a digital signal which carries symbols (e.g., QAM symbols, BPSK symbols, etc.).

The equalization process performed by equalizer 320 may be configured by configuration parameters which are updated/replaced at a rate slower than 1/D (e.g., they may be static or updated only once per span of many symbol periods). Since a corrupted configuration parameter could potentially result in corruption of every received symbol, the configuration parameters may be stored in RDRAM array $304_1$ to prevent them from being corrupted due to cell leakage. Similarly, the equalization process performed by equalizer 320 may be controlled by a series of instructions which are updated/replaced at a rate slower than 1/D (e.g., they may be static or updated only upon initialization of the SoC 102). Accordingly, since a corrupted instruction could potentially result in corruption of every symbol, the RDRAM array $304_1$ may be used as program memory for storing the instructions to prevent the instructions from being corrupted due to cell leakage. Conversely, values of the incoming data signal 319, values of the outgoing data signal 321, and temporary values generated/used during equalization, may be updated/replaced a rate faster than 1/D. Accordingly, such data values may be stored in NDRAM array $306_1$ without increasing the probability of a critical amount of corruption of such data beyond a desired limit. What constitutes a critical amount of corruption is implementation dependent and based on, for example, a number of symbol errors than can be corrected or compensated for by downstream components such as decoder 326; a target metric such as a threshold symbol error rate, a threshold bit error rate, a threshold signal to noise ratio, or the like (e.g., set forth in a standard with which the SoC 102 is to comply); and/or end user experience (e.g., in a video scenario, a number of symbol errors that can be tolerated before the picture is visibly degraded).

As an example, assuming that up to N (an integer) symbols of signal 319 are to be buffered in equalizer 320, then the data values in the buffer may be updated/replaced at a rate of S/N. When S is sufficiently large and/or N is sufficiently small, then S/N>1/D and the buffering may be performed in array $306_1$ without increasing the probability of a critical amount of corruption of such data beyond a desired threshold. Conversely, when S is too small and/or N is too large, then S/N<1/D and the data may (depending on what is considered a critical amount of corruption for the particular implementation) need to be buffered in array $304_1$ to prevent a critical amount of corruption due to cell leakage.

The demapper 322 is operable to process the signal 231 to demap each of the symbols of signal 321 to one or more binary values, and output the binary values as signal 323. For example, the demapper 322 may map each N-QAM symbol of signal 321 to $\log_2(N)$ bits of signal 323.

The demapping process performed by demapper 322 may be configured by configuration parameters which are replaced/updated at a rate slower than 1/D (e.g., they may be static or updated only once per span of many symbol periods). Accordingly, the configuration parameters may be stored in RDRAM array $304_2$ to prevent them from being corrupted due to cell leakage. Similarly, the demapping process performed by demapper 322 may be controlled by a series of instructions which are replaced/updated at a rate slower than 1/D (e.g., they may be static or updated only on initialization of the SoC 102). Accordingly, the RDRAM array $304_2$ may be used as program memory for storing the instructions to prevent the instructions from being corrupted due to cell leakage. Conversely, values of the incoming data signal 319, values of the outgoing data signal 323, and temporary values generated/used during demapping, may be updated/replaced at a rate faster than 1/D. Accordingly, such data values may be stored in NDRAM array $306_2$ without increasing the probability of a critical amount of corruption of such data beyond a desired limit.

The deinterleaver 324 is operable re-order the bits of signal 323 to undo reordering performed in a transmitter from which the signal 319 was received. The deinterleaving process performed by deinterleaver 324 may be configured by configuration parameters which are updated/replaced at a rate slower than 1/D (e.g., they may be static or updated only once per span of many symbol periods). Accordingly, the configuration parameters may be stored in RDRAM array $304_3$ to prevent them from being corrupted due to cell leakage. Similarly, the deinterleaving process performed by deinterleaver 324 may be controlled by a series of instructions which are updated/replaced at a rate slower than 1/D (e.g., they may be static or updated only on initialization of the SoC 102). Accordingly, the RDRAM array $304_3$ may be used as program memory for storing the instructions to prevent the instructions from being corrupted due to cell leakage.

In instances that interleaving is performed across boundaries of M (an integer) symbols, deinterleaving may require buffering M symbols worth of bits of the signal 323 and then completing rearrangement of those bits before the next M symbols arrive. Accordingly, a value may sit on a DRAM cell of the buffer for up to M symbol periods. Thus, if M/S is less than D, the buffering may be performed using NDRAM cells of the array $306_3$ without introducing an unacceptable risk of a critical amount of data corruption, and if M/S is greater than D, the buffering may be performed using RDRAM cells of the array $304_3$. Interleaving may also require temporarily storing bits that are currently being swapped. Typically, such temporary storage will be for less than D, and thus the NDRAM cells of the array $306_3$ can be used.

The decoder 326 is operable to decode the signal 325 in accordance with one or more forward error correction (FEC) protocols/algorithms (e.g., Reed-Solomon, Turbo codes, Low Density Parity Check, and/or the like). The decoding may detect errors in the signal 325 and, in some instances, correct errors in the signal 325 such that signal 327 contains fewer errors.

The decoding process performed by decoder 326 may be configured by configuration parameters which are replaced/updated at a rate slower than 1/D (e.g., they may be static or updated only once per span of many symbol periods). Accordingly, the configuration parameters may be stored in RDRAM array $304_4$ to prevent them from being corrupted due to cell leakage. Similarly, the decoding process performed by decoder 326 may be controlled by a series of instructions which are replaced/updated at a rate slower than 1/D (e.g., they may be static or updated only on initialization of the SoC 102). Accordingly, the RDRAM array $304_4$ may be used as program memory for storing the instructions to prevent the instructions from being corrupted due to cell leakage.

In instances that an FEC codeword spans K (an integer) symbols, deinterleaving may require buffering K symbols worth of bits of the signal 325 and then decoding those bits before the next K symbols arrive. Accordingly, a value may sit on an DRAM cell of the buffer for up to K symbol periods. Thus, if K/S is less than D, the buffering may be performed using NDRAM cells of the array $306_4$ without introducing an unacceptable risk of a critical amount of data corruption, and if K/S is greater than D, the buffering may be performed using RDRAM cells of the array $304_4$. Interleaving may also require temporarily storing values generated during decoding (e.g., messages for a message passing LPDC decoder). Typically, such temporary storage will be for less than D, and thus the NDRAM cells of the array $306_4$ can be used.

In an example implementation, SRAM cells, which do not suffer from the leakage problem that DRAM cells do, may be used instead of one or more of the RDRAM cells of one or more of arrays $304_1$-$304_4$.

Other circuits which may use one or both of RDRAM and NDRAM include, for example, a circuit that performs a fast Fourier transform (FFT), a circuit that performs an inverset fast Fourier transform (IFFT), a filter (e.g., finite impulse response (FIR) or infinite impulse response (IIR)) memory, an analog-to-digital converter, a digital-to-analog converter, and/or the like.

Figure 4:
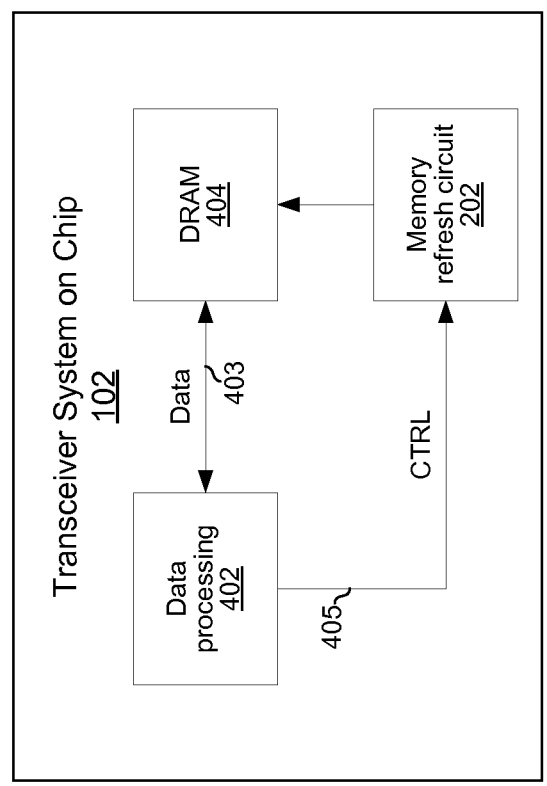
FIG. 4 depicts an example system which is configurable such that in a first mode an array of DRAM cells is used as RDRAM and in a second mode the array is used as NDRAM.

FIG. 4 depicts an example system which is configurable such that in a first mode an array of DRAM cells is used as RDRAM and in a second mode the array is used as NDRAM. Shown is another simplified block diagram of the SoC 102. The data processing circuit 402 may represent, for example, the processor 112 (FIG. 1), the DSP 106, and/or a portion thereof.

The DRAM array 404 may comprise one or more DRAM cells, such as the "1T" cell shown in FIG. 5A.

The memory refresh circuit 202 may be as described above for example. The rate at which circuit 202 performs refreshes may be controlled by the control signal 405. When the refresh rate is greater than zero, the DRAM 404 operates as RDRAM. When the refresh rate is zero, the DRAM 404 operates as NDRAM.

In such an example implementation, the rate of refreshes of array 404 performed by the refresh circuit 202 may be adjusted during run time of the SoC 102 based on a performance parameter (e.g., SNR, SER, BER, and/or the like). For example, the rate of refreshes of array 404 performed by the refresh circuit 202 may be set to zero (i.e., disabled) when a performance parameter (e.g., SNR, SER, BER, and/or the like) is above a threshold, and may be set to greater than zero when the performance parameter is below or equal the threshold.

The rate of refreshes of array 404 performed by the refresh circuit 202 may be adjusted based on a communications standard associated with signals to be transmitted and/or received by the SoC 102. For example, refresh circuitry and/or refreshing of one or more memory cells may be disabled when the system is transmitting and/or receiving signals according to a first particular standard that requires a first, lower SNR (and/or other performance metric), and may be enabled when the system is receiving and/or transmitting signals of a second particular standard that requires a second, higher SNR (and/or other performance metric).

The rate of refreshes of array 404 performed by the refresh circuit 202 may be adjusted based on a bit rate and/or symbol rate of data buffered in the array 404. For example, refreshing of DRAM 404 may be enabled when the symbol rate or bit rate is below a threshold and may be disabled when the bit rate or symbol rate is above the threshold. The refresh rate may be configured at power-up/initialization and/or may occur dynamically as the datastream to which the data belongs is being received or transmitted.

The rate of refreshes of array 404 performed by the refresh circuit 202 may be adjusted based on strength of an error correction code in use for data stored in the array 404. In this regard, a higher code rate may correspond to an ability to correct more errors and, thus, more errors resulting from charge leakage in the array 404 may be tolerated. For example, refresh of the array 404 may be enabled when the code rate of data being buffered in array 404 is less than a threshold value and refresh of the array 404 may be disabled when the code rate is greater than the threshold value.

Figure 6C:
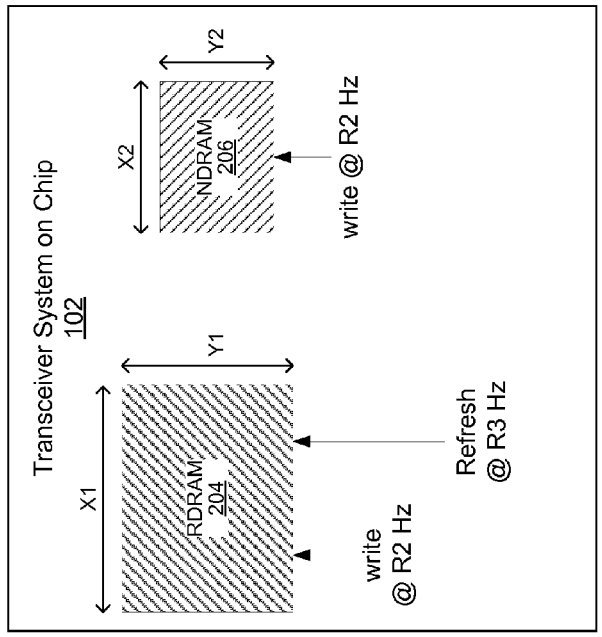
FIGS. 6A-6C illustrate aspects of sizing RDRAM and NDRAM cells.
Figure 6A:
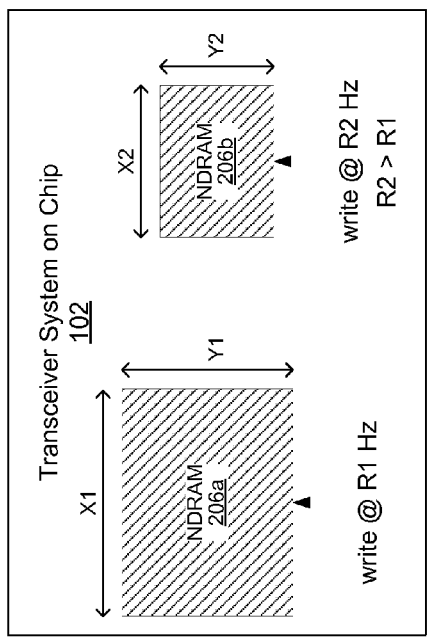
Figure 6B:
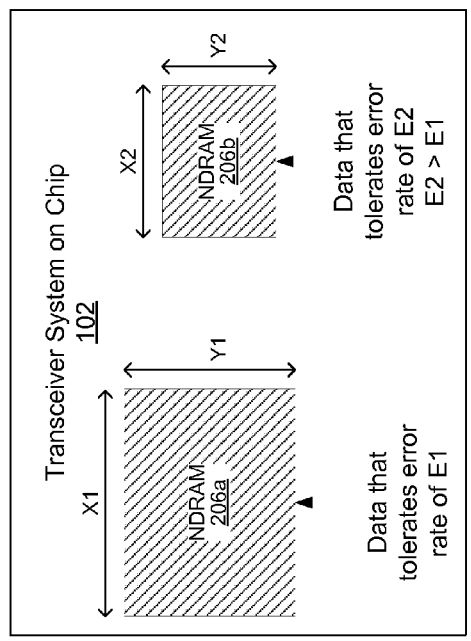

FIGS. 6A-6C illustrate aspects of sizing RDRAM and NDRAM cells. Sizing of cells of the RDRAM array 204 and cells of the NDRAM array 206 may be based on pertinent performance requirements(s) (e.g., tolerable symbol error rate, tolerable bit error rate, minimum signal to noise ratio, and/or the like), strength of error correction algorithms in use, power consumption goals, desired and/or necessary access (read and/or write) times, and/or other parameters that dictate a necessary reliability and/or speed of the DRAM cell.

In FIG. 6A, the contents of a first NDRAM cell (i.e., a single cell array) 206a are updated/replaced at rate of R1, and the contents of a second NDRAM cell (i.e. a single-cell array) 206a are updated/replaced at a rate of R2. Assuming that R2>R1, and that the same probability of error due to leakage can be tolerated for both cells, then the area of 206a (X1×Y1) may be bigger than the area of 206b (X2×Y2).

In FIG. 6C, the RDRAM cell is written at a rate of R2 and refreshed at a rate of R3 and the NDRAM cell is written at a rate of R2. Even though the NDRAM cell and RDRAM cell are written at the same rate, the RDRAM cell is bigger than the NDRAM cell to accommodate overhead (e.g., power, latency, etc.) caused by the refresh. Thus, assuming that the same amount of errors due to leakage can be tolerated for both cells, the RDRAM 204 cell is larger than necessary in the case that R2 is faster than D. Thus, in an example implementation, when R2 is lower than D, the data may be routed to cell 204 of FIG. 6C, and when R2 is higher than D, the data may be routed to the cell 206 of FIG. 6C while refresh of cell 204 is disabled to conserve energy.

Figure 7C:
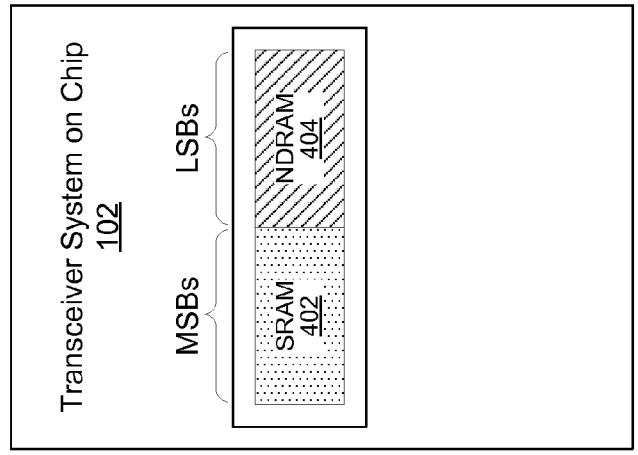
FIGS. 7A-7C depict memory arrays where different types of memory cells are used based on the significance/sensitivity of the bit being stored.
Figure 7B:
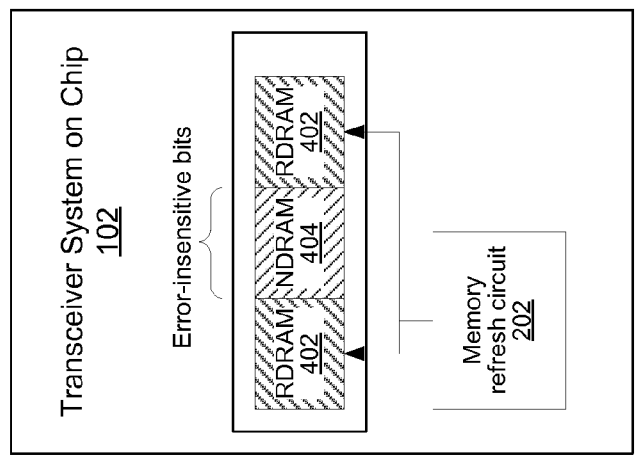
Figure 7A:
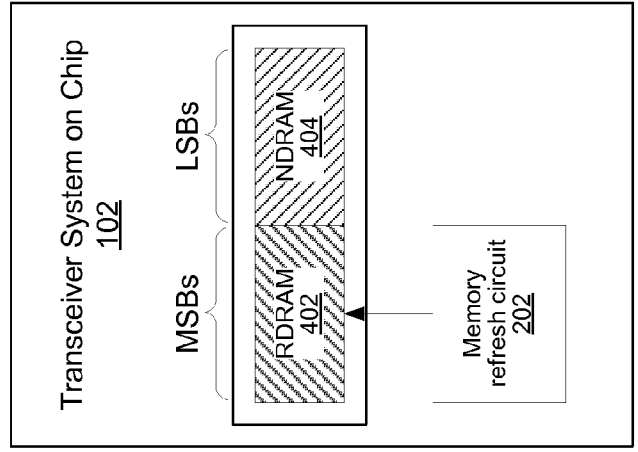

FIGS. 7A-7C depict memory arrays where different types of memory cells are used for different ones of the cells of a particular memory word associated with a particular memory address. Given a RDRAM cell and NDRAM cell of the same size, the RDRAM is less prone to corruption. Accordingly, in some instances, the extra overhead of the RDRAM may be deemed worthwhile to ensure reliability of certain data while NDRAM cells may be used for data that can tolerate more error. For example, corruption of a more significant bit of a word of data may be unacceptable whereas corruption of a less significant bit of the word of data may be more tolerable. Accordingly, RDRAM cells may be used for the MSB(s) and NDRAM cells may be used for the LSB(s), as shown in FIG. 7A.

Even where a word (or words) of data does not have MSB (s) and LSB(s) per se (e.g., the word does not store a single value but a plurality of separate fields) corruption of some bits of the word (or words) may have more of a negative impact on system performance than corruption of others. For example, corruption of header bits of a packet may cause the entire packet to be useless whereas corruption of payload bits may have a relatively minor impact. Accordingly, RDRAM cells may be used for the more critical bits and NDRAM cells may be used for the less-critical bits.

Similarly, rather more-reliable SRAM cells may be mixed with less reliable RDRAM cells and/or even less-reliable NDRAM cells. An example of using SRAM for the MSB(s) of a memory word (or words) and NDRAM of the LSB(s) of the memory word (or words) is shown in FIG. 7C.

In accordance with an example implementation of this disclosure, an integrated circuit (e.g., 102) may comprise a digital logic circuit (e.g., any one or more of 320, 322, 324, and 326), a memory refresh circuit (e.g., 202), a first one or more dynamic random access memory (DRAM) cells (e.g., 204), and a second one or more eDRAM cells (e.g., 206). The first one or more DRAM cells may be refreshed by the memory refresh circuit whereas the second one or more DRAM cells is not refreshed by any memory refresh circuit. Each of the first one or more DRAM cells and the second one or more DRAM cells may be a one-transistor ("1T") cell (e.g., as shown in FIG. 5A).

The first one or more DRAM cells may be used for storage of data which is overwritten at less than a threshold frequency (e.g., instructions and/or configuration parameters). The second one or more DRAM cells may be used for storage of data which is overwritten at greater than the threshold frequency (e.g., received and/or to-be-transmitted data). The first one or more DRAM cells may be used for storage of a first type of data (e.g., packet headers, control channels of an MPEG stream, and/or the like) for which tolerance of errors is low relative to a second type of data (e.g., packet payloads, audio data, video data, and/or the like). The second one or more DRAM cells may be used for storage of the second type of data. The first one or more DRAM cells and the second one or more DRAM cells may be part of a single memory word (i.e., located at the same address). The first one or more DRAM cells may hold first bits of data written to the memory word, and the second one or more DRAM cells may hold second bits of data written to the memory word, where the first bits of data are more significant than the second bits of data.

A rate at which the memory refresh circuit refreshes the first one or more DRAM cells may be adjusted during runtime of the integrated circuit (e.g., as the integrated circuit is receiving and/or transmitting data via a wired or wireless channel). The adjustment of the rate of refresh may comprise an enable of refresh of the first one or more DRAM cells during a first time interval and a disable of refresh of the first one or more DRAM cells during a second time interval. The adjustment of the rate of refresh may be based on a forward error correction code rate of data stored in the first one or more DRAM cells (e.g., rate of refresh may decrease as the code rate goes down and increase as the code rate goes up). The adjustment of the rate of refresh may comprise varying the rate of refresh in response to variations of a symbol rate of signals buffered in the first one or more DRAM cells.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the methods described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
an integrated circuit comprising a digital logic circuit, a memory refresh circuit, a first one or more dynamic random access memory (DRAM) cells, and a second one or more DRAM cells, wherein:
said first one or more DRAM cells is refreshed by said memory refresh circuit;
said first one or more DRAM cells is used, by said digital logic circuit, for storage of data which is overwritten, by new data, at less than a threshold frequency;
said second one or more DRAM cells is not refreshed by any memory refresh circuit; and
said second one or more DRAM cells is used, by said digital logic circuit, for storage of data which is overwritten, by new data, at greater than said threshold frequency.

2. The system of claim 1, wherein each of said first one or more DRAM cells and said second one or more DRAM cells is a one-transistor ("1T") cell.

3. The system of claim 1, wherein:
said first one or more DRAM cells is used, by said digital logic circuit, for storage of one or both of: a configuration parameter, and an instruction; and
said second one or more DRAM cells is used, by said digital logic circuit, for buffering of received and/or to-be-transmitted data.

4. The system of claim 1, wherein:
said first one or more DRAM cells is used, by said digital logic circuit, for storage of a first type of data for which tolerance of errors is low relative to a second type of data; and
said second one or more DRAM cells is used, by said digital logic circuit, for storage of said second type of data.

5. The system of claim 1, wherein:
said first one or more DRAM cells and said second one or more DRAM cells are part of a single memory word;
said first one or more DRAM cells holds first bits of data written to said memory word by said digital logic circuit;
said second one or more DRAM cells holds second bits of data written to said memory word by said digital logic circuit; and
said first bits of data are more significant than said second bits of data.

6. The system of claim 1, wherein a rate at which said memory refresh circuit refreshes said first one or more DRAM cells is adjusted, by said digital logic circuit, during run-time of said integrated circuit.

7. The system of claim 6, wherein said adjustment of said rate of refresh comprises an enable of refresh of said first one or more DRAM cells by said memory refresh circuit during a first time interval and a disable of refresh of said first one or more DRAM cells by said memory refresh circuit during a second time interval.

8. The system of claim 6, wherein said adjustment of said rate of refresh is based on a forward error correction code rate of data stored in said first one or more DRAM cells.

9. The system of claim 6, wherein said adjustment of said rate of refresh comprises variation of said rate of refresh in response to variations of a symbol rate of signals to be buffered in said first one or more DRAM cells.

10. A method comprising:
performing in an integrated circuit comprising a digital logic circuit, a memory refresh circuit, a first one or more dynamic random access memory (DRAM) cells, and a second one or more DRAM cells:
writing, by said digital logic circuit, data to, and reading data from, each of said first one or more DRAM cells and said second one or more DRAM cells;
refreshing, via said memory refresh circuit, said first one or more DRAM cells circuit, wherein said second one or more DRAM cells are not refreshed by any memory refresh circuit;
storing, by said digital logic circuit, data which is overwritten at less than a threshold frequency to said first one or more DRAM cells;
storing, by said digital logic circuit, data which is overwritten at greater than said threshold frequency to said second one or more DRAM cells.

11. The method of claim 10, wherein each of said first one or more DRAM cells and said second one or more DRAM cells is a one-transistor ("1T") cell.

12. The method of claim 10, comprising:
storing, by said digital logic circuit, one or both of: a configuration parameter, and an instruction to said first one or more DRAM cells; and
buffering, by said digital logic circuit, received and/or to-be-transmitted data to said second one or more DRAM cells.

13. The system of claim 10, comprising:
storing, by said digital logic circuit, a first type of data, for which tolerance of errors is low relative to a second type of data, to said first one or more DRAM cells; and
storing, by said digital logic circuit, said second type of data to said second one or more DRAM cells.

14. The method of claim 10, wherein said first one or more DRAM cells and said second one or more DRAM cells are part of a single memory word, and comprising:
storing, by said digital logic circuit, first bits of data written to said memory word in said first one or more DRAM cells;
storing, by said digital logic circuit, second bits of data written to said memory word in said second one or more DRAM cells, wherein
said first bits of data are more significant than said second bits of data.

15. The system of claim 10, comprising adjusting, by said digital logic circuit during run time of said integrated circuit, a rate at which said memory refresh circuit refreshes said first one or more DRAM cells.

16. The system of claim 15, wherein said adjustment of said rate of refresh comprises enabling refresh of said first one or more DRAM cells by said memory refresh circuit during a first time interval and disabling refresh of said first one or more DRAM cells by said memory refresh circuit during a second time interval.

17. The system of claim 15, wherein said adjustment of said rate of refresh is based on a forward error correction code rate of data stored in said first one or more DRAM cells.

18. The system of claim 15, wherein said adjustment of said rate of refresh comprises varying said rate of refresh in response to variations of a symbol rate of signals to be buffered in said first one or more DRAM cells.

19. A system comprising:
an integrated circuit comprising a digital logic circuit, a memory refresh circuit, a first one or more dynamic random access memory (DRAM) cells, and a second one or more DRAM cells, wherein:
said first one or more DRAM cells is refreshed by said memory refresh circuit;
said first one or more DRAM cells is used, by said digital logic circuit, for storage of a first type of data for which tolerance of errors is low relative to a second type of data;
said second one or more DRAM cells is not refreshed by any memory refresh circuit; and
said second one or more DRAM cells is used, by said digital logic circuit, for storage of said second type of data.

20. The system of claim 19, wherein each of said first one or more DRAM cells and said second one or more DRAM cells is a one-transistor ("1T") cell.

21. The system of claim 19, wherein:
said first one or more DRAM cells and said second one or more DRAM cells are part of a single memory word;
said first one or more DRAM cells holds first bits of data written to said memory word by said digital logic circuit;
said second one or more DRAM cells holds second bits of data written to said memory word by said digital logic circuit; and
said first bits of data are more significant than said second bits of data.

22. The system of claim 19, wherein a rate at which said memory refresh circuit refreshes said first one or more DRAM cells is adjusted, by said digital logic circuit, during run-time of said integrated circuit.

23. The system of claim 22, wherein said adjustment of said rate of refresh comprises an enable of refresh of said first one or more DRAM cells by said memory refresh circuit during a first time interval and a disable of refresh of said first one or more DRAM cells by said memory refresh circuit during a second time interval.

24. The system of claim 22, wherein said adjustment of said rate of refresh is based on a forward error correction code rate of data stored in said first one or more DRAM cells.

25. The system of claim 22, wherein said adjustment of said rate of refresh comprises variation of said rate of refresh in response to variations of a symbol rate of signals to be buffered in said first one or more DRAM cells.

26. A system comprising:
an integrated circuit comprising a digital logic circuit, a memory refresh circuit, a first one or more dynamic random access memory (DRAM) cells, and a second one or more DRAM cells, wherein:
said first one or more DRAM cells is refreshed by said memory refresh circuit;
said second one or more DRAM cells is not refreshed by any memory refresh circuit;
said first one or more DRAM cells and said second one or more DRAM cells are part of a single memory word;
said first one or more DRAM cells holds first bits of data written to said memory word by said digital logic circuit;
said second one or more DRAM cells holds second bits of data written to said memory word by said digital logic circuit; and
said first bits of data are more significant than said second bits of data.

27. The system of claim 26, wherein each of said first one or more DRAM cells and said second one or more DRAM cells is a one-transistor ("1T") cell.

28. The system of claim 26, wherein:
said first one or more DRAM cells is used, by said digital logic circuit, for storage of one or both of: a configuration parameter, and an instruction; and
said second one or more DRAM cells is used, by said digital logic circuit, for buffering of received and/or to-be-transmitted data.

29. The system of claim 26, wherein a rate at which said memory refresh circuit refreshes said first one or more DRAM cells is adjusted, by said digital logic circuit, during run-time of said integrated circuit.

30. The system of claim 29, wherein said adjustment of said rate of refresh comprises an enable of refresh of said first one or more DRAM cells by said memory refresh circuit during a first time interval and a disable of refresh of said first one or more DRAM cells by said memory refresh circuit during a second time interval.

31. The system of claim 29, wherein said adjustment of said rate of refresh is based on a forward error correction code rate of data stored in said first one or more DRAM cells.

32. The system of claim 29, wherein said adjustment of said rate of refresh comprises variation of said rate of refresh in response to variations of a symbol rate of signals to be buffered in said first one or more DRAM cells.

33. A system comprising:
an integrated circuit comprising a digital logic circuit, a memory refresh circuit, a first one or more dynamic random access memory (DRAM) cells, and a second one or more DRAM cells, wherein:
said first one or more DRAM cells is refreshed by said memory refresh circuit;
said second one or more DRAM cells is not refreshed by any memory refresh circuit;
a rate at which said memory refresh circuit refreshes said first one or more DRAM cells is adjusted, by said digital logic circuit, during run-time of said integrated circuit; and
said adjustment of said rate of refresh is based on a forward error correction code rate of data stored in said first one or more DRAM cells.

34. The system of claim 33, wherein each of said first one or more DRAM cells and said second one or more DRAM cells is a one-transistor ("1T") cell.

35. The system of claim 33, wherein:
said first one or more DRAM cells is used, by said digital logic circuit, for storage of one or both of: a configuration parameter, and an instruction; and said second one or more DRAM cells is used, by said digital logic circuit, for buffering of received and/or to-be-transmitted data.

36. A system comprising:
an integrated circuit comprising a digital logic circuit, a memory refresh circuit, a first one or more dynamic random access memory (DRAM) cells, and a second one or more DRAM cells, wherein:
said first one or more DRAM cells is refreshed by said memory refresh circuit;
said second one or more DRAM cells is not refreshed by any memory refresh circuit;
a rate at which said memory refresh circuit refreshes said first one or more DRAM cells is adjusted, by said digital logic circuit, during run-time; and
said adjustment of said rate of refresh comprises variation of said rate of refresh in response to variations of a symbol rate of signals to be buffered in said first one or more DRAM cells.

37. The system of claim 36, wherein each of said first one or more DRAM cells and said second one or more DRAM cells is a one-transistor ("1T") cell.

38. The system of claim 36, wherein:
said first one or more DRAM cells is used, by said digital logic circuit, for storage of one or both of: a configuration parameter, and an instruction; and
said second one or more DRAM cells is used, by said digital logic circuit, for buffering of received and/or to-be-transmitted data.

39. A method comprising:
performing in an integrated circuit comprising a digital logic circuit, a memory refresh circuit, a first one or more dynamic random access memory (DRAM) cells, and a second one or more DRAM cells:
writing, by said digital logic circuit, data to, and reading data from, each of said first one or more DRAM cells and said second one or more DRAM cells;
refreshing, via said memory refresh circuit, said first one or more DRAM cells circuit, wherein said second one or more DRAM cells are not refreshed by any memory refresh circuit;
storing, by said digital logic circuit, a first type of data, for which tolerance of errors is low relative to a second type of data, to said first one or more DRAM cells; and
storing, by said digital logic circuit, said second type of data to said second one or more DRAM cells.

40. The method of claim 39, wherein each of said first one or more DRAM cells and said second one or more DRAM cells is a one-transistor ("1T") cell.

41. The method of claim 39, wherein said first one or more DRAM cells and said second one or more DRAM cells are part of a single memory word, and comprising:
storing, by said digital logic circuit, first bits of data written to said memory word in said first one or more DRAM cells;
storing, by said digital logic circuit, second bits of data written to said memory word in said second one or more DRAM cells, wherein said first bits of data are more significant than said second bits of data.

42. The system of claim 39, comprising adjusting, by said digital logic circuit during run time of said integrated circuit, a rate at which said memory refresh circuit refreshes said first one or more DRAM cells.

43. The system of claim 42, wherein said adjustment of said rate of refresh comprises enabling refresh of said first one or more DRAM cells by said memory refresh circuit during a first time interval and disabling refresh of said first one or more DRAM cells by said memory refresh circuit during a second time interval.

44. The system of claim 42, wherein said adjustment of said rate of refresh is based on a forward error correction code rate of data stored in said first one or more DRAM cells.

45. The system of claim 42, wherein said adjustment of said rate of refresh comprises varying said rate of refresh in response to variations of a symbol rate of signals to be buffered in said first one or more DRAM cells.

46. A method comprising:
performing in an integrated circuit comprising a digital logic circuit, a memory refresh circuit, a first one or more dynamic random access memory (DRAM) cells, and a second one or more DRAM cells:
writing, by said digital logic circuit, data to, and reading data from, each of said first one or more DRAM cells and said second one or more DRAM cells, wherein said first one or more DRAM cells and said second one or more DRAM cells are part of a single memory word;
refreshing, via said memory refresh circuit, said first one or more DRAM cells circuit, wherein said second one or more DRAM cells are not refreshed by any memory refresh circuit;
storing, by said digital logic circuit, first bits of data written to said memory word in said first one or more DRAM cells;
storing, by said digital logic circuit, second bits of data written to said memory word in said second one or more DRAM cells, wherein said first bits of data are more significant than said second bits of data.

47. The method of claim 46, wherein each of said first one or more DRAM cells and said second one or more DRAM cells is a one-transistor ("1T") cell.

48. The method of claim 46, comprising:
storing, by said digital logic circuit, one or both of: a configuration parameter, and an instruction to said first one or more DRAM cells; and
buffering, by said digital logic circuit, received and/or to-be-transmitted data to said second one or more DRAM cells.

49. The system of claim 46, comprising adjusting, by said digital logic circuit during run time of said integrated circuit, a rate at which said memory refresh circuit refreshes said first one or more DRAM cells.

50. The system of claim 49, wherein said adjustment of said rate of refresh comprises enabling refresh of said first one or more DRAM cells by said memory refresh circuit during a first time interval and disabling refresh of said first one or more DRAM cells by said memory refresh circuit during a second time interval.

51. The system of claim 49, wherein said adjustment of said rate of refresh is based on a forward error correction code rate of data stored in said first one or more DRAM cells.

52. The system of claim 49, wherein said adjustment of said rate of refresh comprises varying said rate of refresh in response to variations of a symbol rate of signals to be buffered in said first one or more DRAM cells.

53. A method comprising:
performing in an integrated circuit comprising a digital logic circuit, a memory refresh circuit, a first one or more dynamic random access memory (DRAM) cells, and a second one or more DRAM cells:
writing, by said digital logic circuit, data to, and reading data from, each of said first one or more DRAM cells and said second one or more DRAM cells;

refreshing, via said memory refresh circuit, said first one or more DRAM cells circuit, wherein said second one or more DRAM cells are not refreshed by any memory refresh circuit; and adjusting, by said digital logic circuit during run time of said integrated circuit, a rate at which said memory refresh circuit refreshes said first one or more DRAM cells, wherein said adjustment of said rate of refresh is based on a forward error correction code rate of data stored in said first one or more DRAM cells.

54. The method of claim 53, wherein each of said first one or more DRAM cells and said second one or more DRAM cells is a one-transistor ("1T") cell.

55. The method of claim 53, comprising:
storing, by said digital logic circuit, one or both of: a configuration parameter, and an instruction to said first one or more DRAM cells; and
buffering, by said digital logic circuit, received and/or to-be-transmitted data to said second one or more DRAM cells.

56. A method comprising:
performing in an integrated circuit comprising a digital logic circuit, a memory refresh circuit, a first one or more dynamic random access memory (DRAM) cells, and a second one or more DRAM cells:

writing, by said digital logic circuit, data to, and reading data from, each of said first one or more DRAM cells and said second one or more DRAM cells;

refreshing, via said memory refresh circuit, said first one or more DRAM cells circuit, wherein said second one or more DRAM cells are not refreshed by any memory refresh circuit; and adjusting, by said digital logic circuit during run time of said integrated circuit, a rate at which said memory refresh circuit refreshes said first one or more DRAM cells, wherein said adjustment of said rate of refresh comprises varying said rate of refresh in response to variations of a symbol rate of signals to be buffered in said first one or more DRAM cells.

57. The method of claim 56, wherein each of said first one or more DRAM cells and said second one or more DRAM cells is a one-transistor ("1T") cell.

58. The method of claim 56, comprising:
storing, by said digital logic circuit, one or both of: a configuration parameter, and an instruction to said first one or more DRAM cells; and
buffering, by said digital logic circuit, received and/or to-be-transmitted data to said second one or more DRAM cells.

* * * * *